(12) United States Patent
Fukuda et al.

(10) Patent No.: US 7,358,736 B2
(45) Date of Patent: Apr. 15, 2008

(54) LOW TEMPERATURE PROBE FOR NMR AND NMR DEVICE

(75) Inventors: Yuzo Fukuda, Hitachi (JP); Hiromitsu Seino, Iwaki (JP); Kazuo Saitoh, Kodaira (JP); Hiroyuki Tanaka, Mito (JP); Tsuyoshi Wakuda, Hitachinaka (JP); Norihide Saho, Tsuchiura (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/493,819

(22) Filed: Jul. 27, 2006

(65) Prior Publication Data

US 2007/0096740 A1  May 3, 2007

(30) Foreign Application Priority Data

Jul. 29, 2005  (JP) .............................. 2005-220299

(51) Int. Cl.
*G01V 3/00* (2006.01)
(52) U.S. Cl. ...................................... 324/321
(58) Field of Classification Search ......... 324/300–322
See application file for complete search history.

(56) References Cited

U.S. PATENT DOCUMENTS

| | | | | |
|---|---|---|---|---|
| 4,489,275 A | * | 12/1984 | Sancier et al. | 324/315 |
| 6,437,570 B2 | * | 8/2002 | Marek | 324/321 |
| 6,441,617 B2 | * | 8/2002 | Marek | 324/318 |
| 6,859,036 B2 | * | 2/2005 | Aihara et al. | 324/321 |
| 7,084,634 B2 | * | 8/2006 | Morita et al. | 324/321 |
| 7,208,954 B2 | * | 4/2007 | Aihara et al. | 324/321 |
| 2003/0107376 A1 | * | 6/2003 | Yasuhara | 324/318 |
| 2004/0257082 A1 | * | 12/2004 | Wakuda et al. | 324/318 |
| 2006/0038567 A1 | * | 2/2006 | Morita et al. | 324/318 |
| 2006/0109006 A1 | * | 5/2006 | Wakuda et al. | 324/319 |
| 2007/0052421 A1 | * | 3/2007 | Wakuda et al. | 324/321 |

FOREIGN PATENT DOCUMENTS

| | | |
|---|---|---|
| JP | 2003-329755 | 11/2003 |
| JP | 2003-329756 | 11/2003 |

* cited by examiner

*Primary Examiner*—Brij Shrivastav
*Assistant Examiner*—Dixomara Vargas
(74) *Attorney, Agent, or Firm*—Antonelli, Terry, Stout & Kraus, LLP.

(57) ABSTRACT

The invention provides a low temperature probe having a high sensitivity by reducing a heat intrusion into a receive coil. A heat making an intrusion into a coil is suppressed by inserting a heat radiation shield in which a temperature is controlled at about 100 K to a portion between an outer container of a probe and a coil portion. A heat radiation shield bore sleeve is provided in a heat radiation bore, is connected to the heat radiation shield, and is cooled by a second heat exchanger. Further, the coil portion is cooled by a first heat exchanger. In preparation for a contraction at a time of being cooled, the outer container, the heat radiation shield and the coil portion are connected by using a fixing portion, and a heat relieving mechanism or a contraction relieving mechanism is provided in a root side (an opposite side to the fixing portion) of the heat radiation shield and the coil portion. The fixing portion is formed in a shape and made of a material having a small heat intrusion amount and having a small heat contraction.

8 Claims, 7 Drawing Sheets

BEFORE COOLING

AFTER COOLING

LOW TEMPERATURE PROBE FOR NMR AND NMR DEVICE

BACKGROUND OF THE INVENTION

1. Field of the Invention

The present invention relates to a nuclear magnetic resonance (NMR) device, and more particularly to a low temperature probe for the NMR.

2. Description of Related Art

In the NMR device, since a nuclear magnetic resonance signal of a hydrogen nucleus has a better sensitivity than the other nuclei, the NMR device is used as a tool for analyzing a molecular structure of an organic matter. In an advanced life science research and a biological field, it measures a protein having a large molecular weight and is used for researches such as a search and analysis of an interaction between structures of molecules corresponding to a feature of the NMR and with respect to the other molecules, in addition to the molecular structure. In order to execute a structural analysis of the protein at a high speed, it is absolutely necessary to make the NMR device highly sensitive. The NMR device in recent years generates a high magnetic field by utilizing a superconducting magnet, and can achieve a high sensitive detection by cooling a detection coil.

Patent documents 1 (JP-A-2003-329755 and Patent document 2 (JP-A-2003-329756) describe an NMR device characterized by a horizontal insertion type probe by arranging a solenoid type receiver coil in a horizontal magnetic field magnet. In accordance with this structure, a signal detecting efficiency is more excellent in comparison with a saddle type receiver coil.

The NMR probe in the patent documents mentioned above is not sufficient about the cooling structure of the receiver coil for enabling the high sensitive measurement. When actuating the low temperature probe, the receiver coil is cooled, however, a probe container is not cooled but is kept at a room temperature.

In a device for executing a general very low temperature cooling, an internal portion of the container of the device is made vacuum, and a heat transmission by a gas is adjusted. All the same, since a heat is transferred to the internal portion due to a radiation heat, the structure is made such as to reduce the radiant heat, and employ a heat radiation shield in which a temperature is kept at about 70 K to 100 K, a reflector material, and a laminated heat insulating material installed in an outer side thereof and formed by laminating heat insulating materials in multilayer. It is possible to limit the transfer of the heat due to the heat radiation which is in proportion to a difference between biquadrates of the temperatures to $1/100$ by changing a surface visible from the internal very low temperature 100 K or smaller from about 300 K corresponding to the room temperature.

However, in order to use the heat shield technique as it is, the portion around the coil in the low temperature probe is hard due to a spatial restriction. Since a detecting sensitivity of the receiver coil is more improved in accordance that the receiver coil is closer to a sample, it is preferable to make a gap between an outer wall of a sample space and the receiver coil smaller, and the gap is set to be equal to or smaller than 1 mm.

Particularly, there is generated the other problems in the low temperature probe in connection with the cooling. Most of the constituting materials of the low temperature portion of the low temperature probe generates a contraction by being cooled. For example, a copper and an aluminum used for improving a heat conduction generates the contraction at 0.3 to 0.4% of its length at a time of being cooled to a very low temperature from the room temperature. Accordingly, a displacement is generated in the coil and the gap between the receiver coil and the sample is increased, thereby deteriorating the sensitivity.

The present invention is made by taking the problem of the prior art mentioned above into consideration, and an object of the present invention is to provide a low temperature probe which can efficiently cool a coil in a narrow space, has a small thermal noise and can execute a high sensitive measurement, and an NMR apparatus using the same.

BRIEF SUMMARY OF THE INVENTION

In order to achieve the object mentioned above, in accordance with the present invention, there is provided a low temperature probe for an NMR comprising:

a cylindrical outer container forming an outer shape of the probe and keeping an inner portion vacuum;

a cylindrical sample insertion portion formed in a vertical direction to an axial direction of the outer container;

a coil portion having a transmit and receive coil and arranged in such a manner as to surround the sample insertion portion; and a first heat radiation shield kept at a temperature lower than an external temperature and higher than a temperature of the coil portion, the first heat radiation shield between arranged between the outer container and the coil portion.

Further, a second heat radiation shield is provided at a small gap with respect to the sample insertion portion, in an inner side of a penetration portion of the heat radiation shield and the transmit and receive coil through which the sample insertion portion passes, and the first heat radiation shield and the second heat radiation shield are thermally connected.

Further, the coil portion and the first heat radiation shield are supported by a fixing portion extending in an axial direction from a leading end of the outer container.

EFFECT OF THE INVENTION

In accordance with the low temperature probe for the NMR on the basis of the present invention, it is possible to inhibit the heat from making an intrusion into the coil and it is possible to effectively cool the receive coil by inserting the heat radiation shield in which the temperature is controlled, between the outer container of the probe and the coil. Further, since it is possible to absorb a displacement of the receive coil caused by the cooling, it is possible to increase a measuring sensitivity.

Other objects, features and advantages of the invention will become apparent from the following description of the embodiments of the invention taken in conjunction with the accompanying drawings.

DETAILED DESCRIPTION OF THE INVENTION

A description will be given below of a plurality of embodiments in accordance with the present invention with reference to the accompanying drawings.

Embodiment 1

Figure 2:
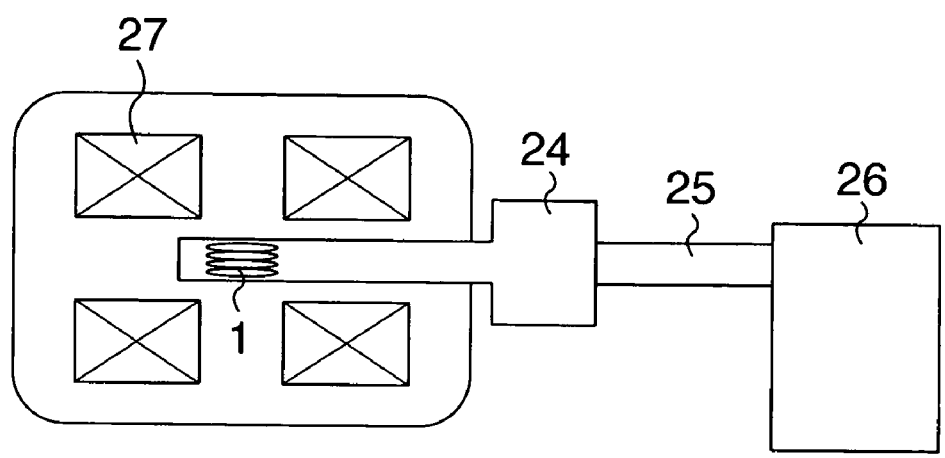
FIG. 2 is a schematic view of a horizontal insertion type NMR device.

FIG. 2 is a schematic view of an NMR device. The NMR device in accordance with the present embodiment is characterized by a horizontal insertion type low temperature probe 24 in which a horizontal magnetic field split magnet 27 and a solenoid type receive coil 1 are arranged. The probe 24 and a cooling device 26 are connected by a transfer tube 25.

Figure 1:
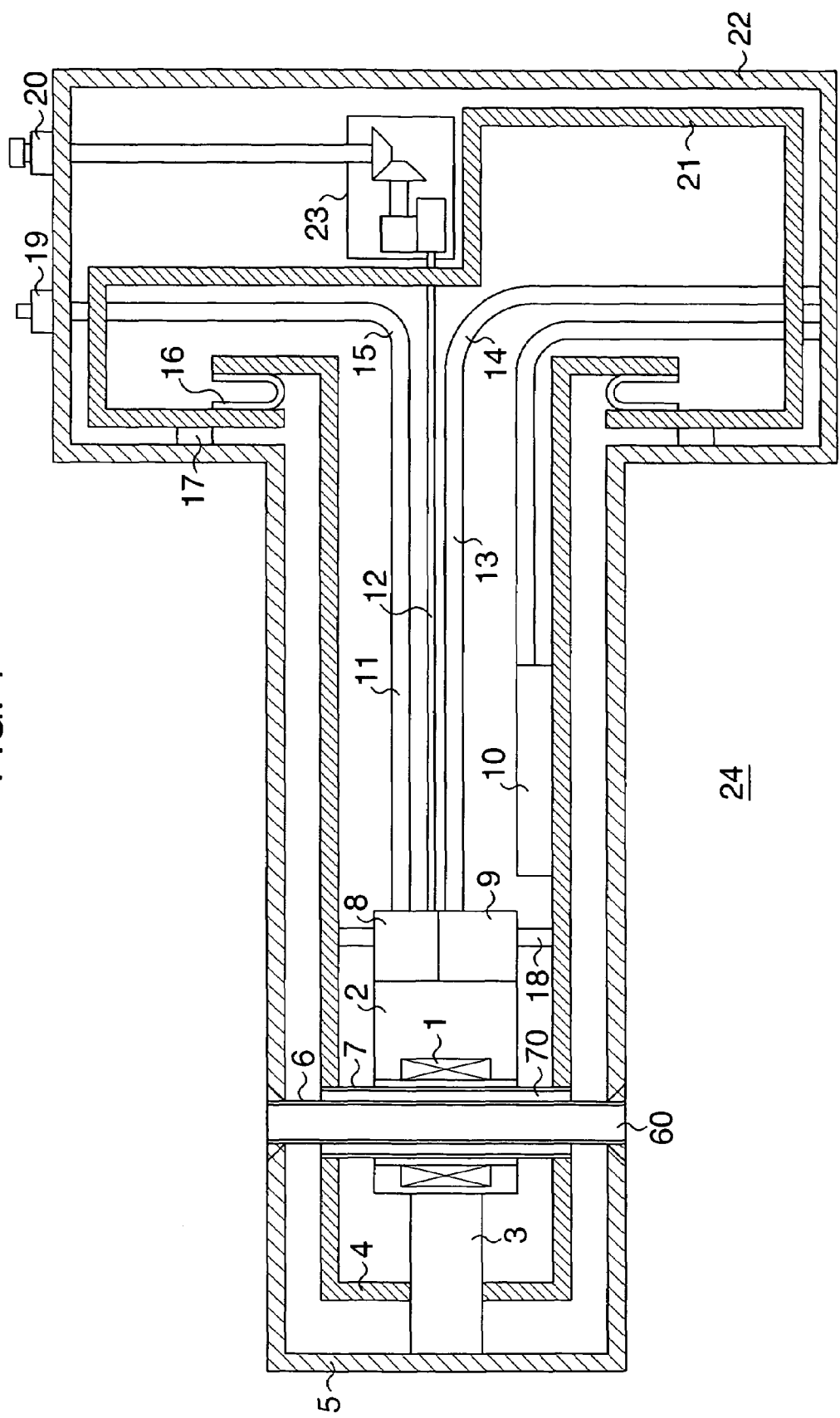
FIG. 1 is a schematic view of a low temperature probe in accordance with an embodiment 1 of the present invention.

FIG. 1 shows a structure of a low temperature probe in accordance with an embodiment. There is shown a case that a length direction of a magnet insertion portion outer container of the low temperature probe 24 is orthogonal to an inserting axial direction of a sample tube. A leading end direction of the probe and a root direction of the probe are particularly differentiated with respect to the length direction of the magnet insertion portion of the low temperature probe 24.

A coil portion 2 is provided with a receive coil and a transmit coil. A detection of an NMR signal is executed by the receive coil, and a irradiation of a radiofrequency wave is executed by the transmit coil. In this case, the receive coil and the transmit coil are constituted by the same coil and are formed as a transmit and receive coil 1 serving both as the transmit coil and the receive coil. A shape of the receive coil or the transmit coil may be formed in a solenoid type or a saddle type, however, the solenoid type has a better signal detecting efficiency and can increase a measuring sensitivity more. A number of the transmit and receive coils is constituted by at least one transmit coil and at least one receive coil in correspondence to a number of nuclei necessary to be transmitted and received. A minimum coil number is one in which the transmit and receive coils are integrated. Normally, three of four nuclei are measured by about two coils. In this case, the present invention relates to a cooling and fixing method of the coil portion 2 provided with at least one coil, regardless of the number of the coils.

The coil portion 2 is constituted by a conductive coil conductor and an insulative coil support body. The coil support body suitably employs an aluminum nitride (AlN) or a sapphire ($Al_2O_3$) having a good thermal conductivity and corresponding to the insulative body for uniformly cooling the coil conductor. The conductor of the coil is constituted by a wide conductor for enlarging a thermal contact with the support body, and is closely attached thereto. Alternatively, a metal thin film or a small piece is pinched or soldered between the coil conductor and the support member.

An electric circuit portion 8 is installed in a root side of the coil portion 2, and a resonance circuit is formed by the electric circuit and the transmit and receive coil. A resonance frequency of the resonance circuit is regulated in such a manner as to tune in a nuclear magnetic resonance frequency of the nuclei to be measured. Further, an impedance of a load is regulated (aligned) for a high frequency measurement. The tuning and the alignment use a variable condenser (not shown). The variable condenser is regulated by a rotation rod 12, and the rotating rod 12 extends to an external portion through an inner side of the probe container. Since the rotating rod 12 is contracted on the basis of the thermal contraction, the rotating rod 12 is provided with a thermal contraction absorbing mechanism 23 absorbing this thermal contraction.

Figure 3A:
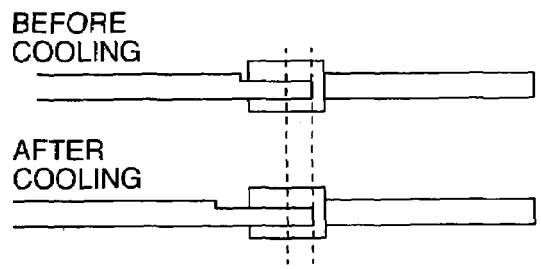
FIGS. 3A-3C is a schematic view showing a bending mechanism for relieving a heat contraction of a cooling medium piping and a coaxial cable.
Figure 3B:
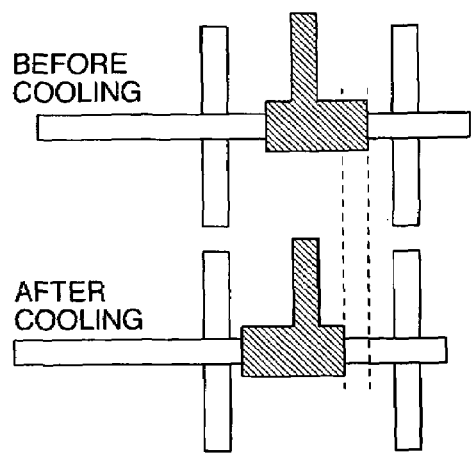
Figure 3C:
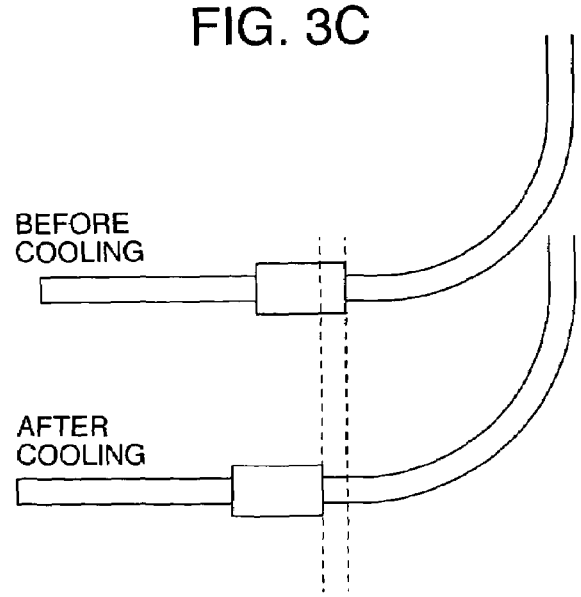

FIGS. 3A, 3B and 3C show an outline of the thermal contraction absorbing mechanism. FIG. 3A shows a mechanism for absorbing on the basis of a slip by elongating a connection portion, FIG. 3B shows a mechanism for absorbing on the basis of the slip by elongating a toothed gear of a gear, and FIG. 3C shows a mechanism for absorbing on the basis of a bending of a flexible shaft. In the case of directly elongating the rotating shaft out of the container so as to take out, the method of slipping the connection portion in FIG. 3A is preferable. In the case of changing a position to be taken out or an angle, the method using the flexible shaft in FIG. 3C or the gear in FIG. 3B is preferable.

A coaxial cable 11 is used for transmitting the high frequency signal corresponding to the transmit and receive signals. There are a flexible cable in which an outer conductor is constituted by a copper net wire and a semi-rigid cable in which the outer conductor is constituted by a pipe shape, however, the semi-rigid cable is excellent in the light of an electric property such as an attenuation factor of a transmission signal or the like. The thermal contraction is absorbed by forming a bent portion 15 in the coaxial cable 11.

Figure 4A:
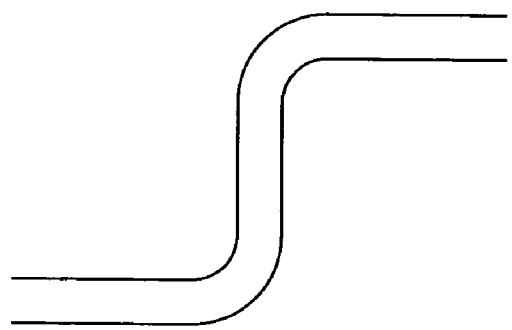
FIGS. 4A-4C is a schematic view showing a bending mechanism for relieving a heat contraction of an adjusting shaft.
Figure 4B:
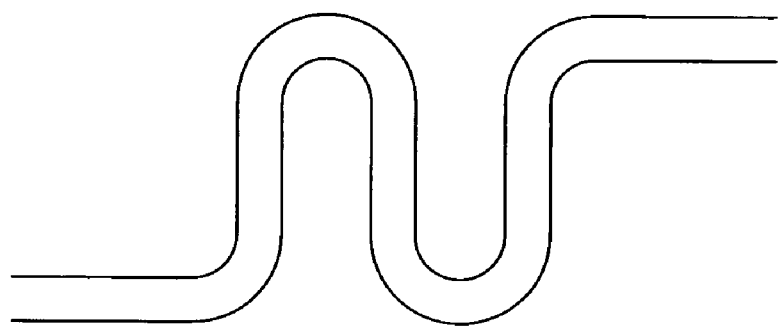
Figure 4C:
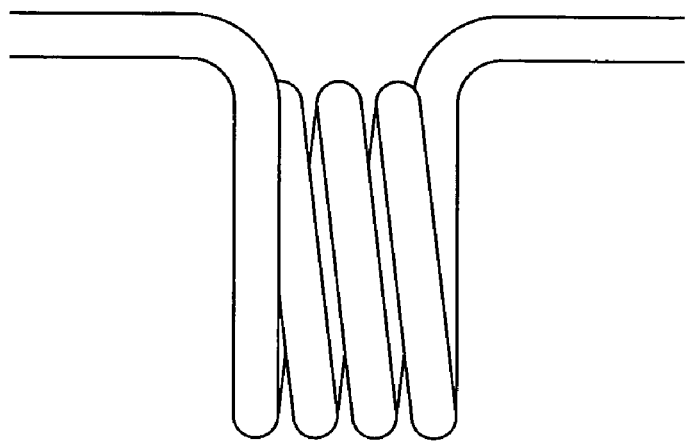

FIGS. 4A, 4B and 4C show a shape of the bent portion of the coaxial cable. FIG. 4A shows the bent portion obtained by simply bending, FIG. 4B shows the bent portion obtained by repeatedly bending so as to meander, and FIG. 4C shows the bent portion obtained by spirally winding. Actually, these methods are spatially combined so as to obtain an amount of elongation and an elongating direction to be demanded, in most cases.

Both of the coil portion 2 and the electric circuit portion 8 are cooled to a very low temperature equal to or lower than 20 K. The cooling method of the coil portion 2 includes a method of directly cooling by a cooling medium gas or liquid, and a method of cooling on the basis of a conduction, and the present embodiment employs the latter. Since the periphery of the coil 1 is kept vacuum, and the periphery of the coil 1 does not easily discharge electricity even if some kV of voltage is applied, the method of cooling on the basis of the conduction is advantageous in the light of a voltage proof. In the case of cooling on the basis of the conduction, a heat exchanger 9 is provided, the heat exchanger is directly cooled by the cooling medium, and the heat is transmitted on the basis of a heat transfer path to the coil 1.

A return cooling medium piping 13 is attached to the heat exchanger 9. A bent portion 14 is provided in the cooling medium piping 13 to the heat exchanger 9 so as to absorb the thermal contraction. A bent shape of the piping is formed by the same method as the cable. Since a shaft, a cable and a pipe are made of a SUS, a copper or the like, and an amount of contraction at a time of cooling to the low temperature from the room temperature is 0.3 to 0.4% of the length, the structure is made such as to secure an elongation capable of absorbing the contraction amount.

A spacer 18 brought into contact with the heat radiation shield 4 is installed in a root side of the electric circuit portion 8. The spacer 18 has a function of supporting a weight of the electric circuit portion 8 and the coil portion 2 and aligning a center position of the coil. Since it is necessary that the spacer 18 is insulated heat for inhibiting the heat from making an intrusion into the very low temperature portion, the space 18 is formed, for example, in such a shape that legs are attached to a pipe made of an FRP. It is possible to approximately bring an axis of the coil 1 into line with an axis of the heat radiation shield 4, on the basis of a layout of the fixing portion 3 from the leading end of the probe and the spacer 18.

A sample insertion space (a sample bore) 60 is formed in an inner side of the cylindrical sample bore sleeve 6 vertically to the axis of the cylindrical outer container 5.

Since the heat contraction is generated with respect to the heat radiation shield 4, a heat contraction relieving mechanism 16 relieving the heat contraction is provided. It is made movable in a direction z by a leaf spring, and a direction of a force applied to the fixing portion 3 is always set to the same direction. Accordingly, a tensile force is always applied to the fixing portion 3, and a compression force is always applied to the outer container 5, so that it is easy to design it.

The heat radiation shield 4 is arranged on the periphery of the coil portion 2 and the electric circuit portion 8 for cooling the coil portion 2 and the electric circuit portion 8 to the very low temperature. Further, a bore heat radiation shield (sleeve) 7 serving as a second heat radiation shield is arranged in an inner side of the heat radiation shield bore 70.

The heat radiation shield 4 and the heat radiation shield 7 are structured such that a thickness portion of the shield 4 is connected to outer peripheries of upper and lower end portions of the heat radiation shield 7. The connection in this portion increases a heat conduction of the contact portion by filling an adhesive agent in a contact surface so as to adhere. It is desirable that the adhesive agent does not include the nuclei to be measured by the NMR. For example, in the probe measuring the hydrogen nucleus (1H), it is possible to execute the measurement by making an unnecessary signal less in the case of using a structure in which a hydrogen in a heavy hydrogen or a fluorine is substituted with the hydrogen in the adhesive agent. Accordingly, it is possible to make the radiation heat applied to the receive coil 1 small, and it is possible to cool the receive coil 1 to the lower temperature.

About 2 W of heat makes an intrusion into the surface of the coil portion 2 kept at the very low temperature from the room temperature on the basis of the radiation heat. Since all the heat making an intrusion into the very low temperature portion becomes a thermal load of a refrigerator, a supply temperature of the cooling medium ascends. A cooling capacity of a second stage of a general GM refrigerator is 1.5 W at 4.2 K, and becomes about 6 K with respect to an increase of the thermal load of 2 W, and the supply temperature of the cooling medium rises. Further, since the coil 1 is cooled on the basis of the heat transmission, the intruded heat causes an increase of the coil temperature. Since a thermal noise is in proportion to a half power of the temperature, the noise in the signal is increased if the temperatures of the coil portion 2 and the electric circuit portion 8 rise, so that a sensitivity is deteriorated.

On the contrary, it is possible to reduce an amount of heat intrusion on the basis of the heat radiation to about 1/80 by installing the heat radiation shields 4 and 7 in which the temperature is at 100 K. The heat radiation shields 4 and 7 are cooled by a second heat exchanger 10 installed in a root direction. A piping of the heat exchanger 10 is structured such that a heat exchanger 9 cooling the coil portion 2 and a piping connecting a cooling device (not shown) form a pair of loops, whereby the cooling medium gas can be circulated by one compressor.

Considering with reference to a capacity of the general GM refrigerator, the temperature of the cooling medium supplied to the first heat exchanger 9 is about 4 K, and the temperature of the cooling medium gas supplied to the second heat exchanger 10 is about 50 K. Accordingly, it is easy to keep the heat radiation shields 4 and 7 in the periphery of the coil portion at the temperature equal to or less than 100 K, and it is possible to shield the radiation heat from the room temperature so as to obtain a sufficient heat insulating effect.

Next, a description will be given of a correspondence with respect to a problem of the heat contraction at a time of installing the heat radiation shield. If the leaf spring 16 connecting the heat radiation shield 4 and a magnet external portion heat radiation shield 21 is set to an improved heat transmission, it is possible to make the temperature of the heat radiation shield 4 approximately identical with the temperature of the magnet external portion heat radiation shield 21. For example, the leaf spring 16 is preferably formed in a shape in which a plurality of copper plates and indium plates are laminated.

In order to improve a detection efficiency, it is preferable to make the sample and the receive coil conductor as close as possible. For an outer diameter 5 mm of a standard sample tube, a wall of a sample space is 5.5 to 6 mm, and an inner diameter of the receive coil is about 10 mm. If the sample bore sleeve 6 and the bore heat radiation shield (the heat radiation shield sleeve) 7 maintaining a vacuum condition are installed therebetween, a gap between the sleeve 6 and the shield 7 becomes equal to or less than 0.5 mm, and a narrow gap is more oppressed. Accordingly, a device for well avoiding the contact is necessary.

Figure 5A:
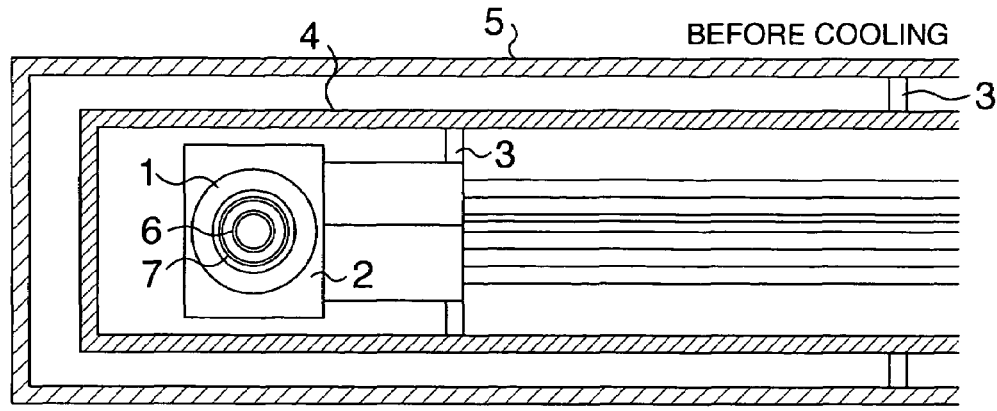
FIGS. 5A-5B is an explanatory view showing a displacement state by the heat contraction.
Figure 5B:
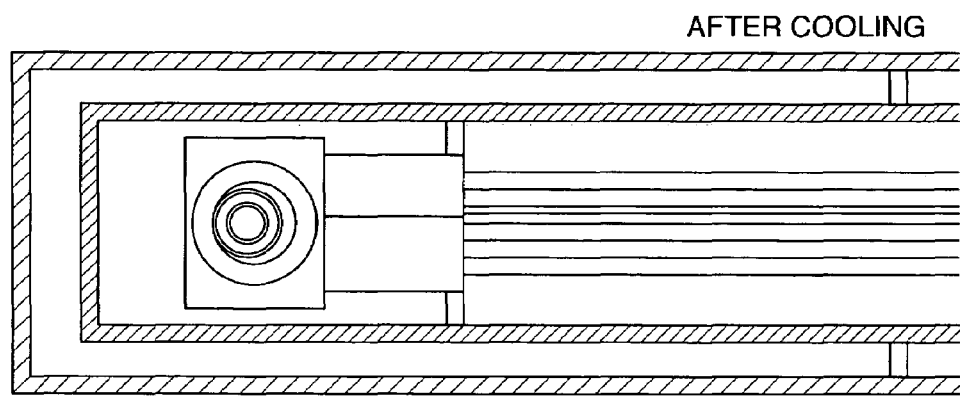

FIGS. 5A and 5B show a condition of the heat contraction of the coil portion before and after cooling. As shown in FIG. 5A, in the coil 1 existing at the normal position before being cooled, the coil conductor is contracted on the basis of the very low temperature after being cooled, and a displacement is generated.

In the present embodiment, the problem that the coil portion 2 is moved in accordance with the heat contraction is solved by forming the fixing portion 3 from the leading end, and connecting the coil 1 and the outer container 5. Further, since the outer container 5 and the heat radiation shield 4, and the heat radiation shield 4 and the coil portion 2 are simultaneously connected via the fixing portion in the same manner, a positional relation of the sample insertion portion is kept even if the heat contraction is generated in the coil portion 2.

Figure 6:
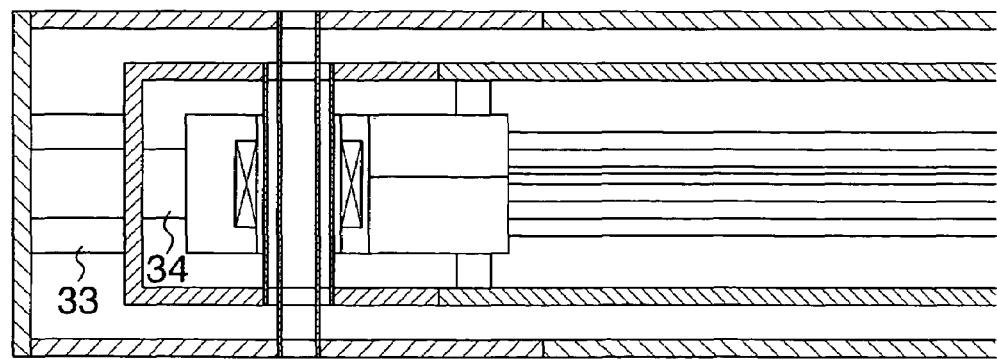
FIG. 6 is a schematic view of a low temperature probe showing a modified embodiment of a fixing portion in accordance with the embodiment 1.

FIG. 6 shows a modified embodiment of the structure of the fixing portion. In FIG. 6, there is shown a structure in which the fixing portion 3 in FIG. 1 is divided into a fixing portion 33 fixing the outer container 5 and the heat radiation shield 4, and a fixing portion 34 fixing the heat radiation shield 4 and the coil portion 2. In accordance with this structure, since it is possible to avoid the contraction coming into question before and after cooling the transmit and receive coil 1 existing in the inner portion, it is unnecessary to be sensitive about a heat contraction rate of the material.

In the heat radiation shield 4, the temperature change is generated from the room temperature to about 100 K. Accordingly, the heat contraction is generated, however, if the heat contraction is sufficiently smaller than an amount of the gap to be secured in the sample insertion portion, the heat contraction is negligible. The same matter can be applied to an amount of contraction between the fixing portion 3 and the coil portion 2. The material of the coil portion 2 is constituted by the aluminum nitride or the sapphire as mentioned above, and these materials have a good heat conductivity and hardly have any contraction at a time of being cooled. Further, the heat radiation shield 4 of 100 K normally employs the metal having the good heat conductivity such as the copper, the aluminum or the like, for the conductive cooling. The metal material generates a contraction at about 0.3% of an entire length by being cooled to 100 K or less from the room temperature.

Accordingly, the aluminum nitrogen having the good heat conductivity and the small contraction rate is employed from the leading end to the sample space portion. The fixing portion 3 preferably employs a material in which the heat insulating property is provided and the heat contraction amount is small at a time of cooling to the low temperature from the room temperature. For example, a silica glass, a Pyrex glass (trade mark) or the lie is employed.

It is possible to more effectively balance the heat insulating performance and the heat contraction amount by changing the shape of the fixing portion 3. The total heat contraction amount is determined as shown by numerical expression 1 on the basis of a length of the fixing portion, the temperature distribution and the heat contraction rate.

$$\Delta L = \int_0^L \epsilon(T) dx \qquad 1$$

In this case, $\Delta L$ denotes a contraction amount, L denotes a length, $\epsilon$ denotes a contraction rate, and T denotes a temperature. On the other hand, the heat intruding amount is determined as shown by numerical expression 2 on the basis of the length of the fixing portion, the cross sectional area, the temperature distribution and the thermal conductivity.

$$Q = \int_{T_L}^{T_H} \lambda(T) \cdot A/L \qquad 2$$

In this case, $\lambda$ denotes a heat conductivity, and A denotes a cross sectional area. Integrated values of the thermal conductivities of the typical materials are described in Superconduction and cryogenic engineering handbook (Ohm company), and can be actually measured.

Since a position accuracy of the coil is within 100 μm, desirably within 50 μm, it is possible to determine a maximum length in accordance with the numerical expression 1. Since the difference of length between before being cooled and after being cooled becomes equal to or less than 0.05% in the case of the material having the small heat contraction rate such as the silica glass or the like mentioned above, it is possible to achieve the change equal to or less than 50 μm in the case that the distance of the fixing portion 3 fixed to the outer container 5 is equal to or less than 100 mm.

In order to suppress the heat intrusion amount, it is preferable to make a heat transfer cross sectional area of the fixing portion 3 small, and a hollow cylinder can be considered. For example, it is possible to limit the displacement to 50 μm or less, and the intruding heat amount to 50 mW or less, by setting the shape of the fixing portion to a hollow cylinder having a length of 80 mm, an outer diameter of 14 mm and an inner diameter of 8 mm.

Since three elements comprising the outer container 5, the heat radiation shield 4 and the coil portion 2 in connection with the sample insertion port are connected at a comparatively short distance via the fixing portion, it is possible to precisely determine an initial position at the room temperature by determining the connecting position to the fixing portion 3.

As mentioned above, there is shown the embodiment of the low temperature probe in which the cylindrical shaft is extended with respect to the inserting direction from the horizontal direction, and the sample insertion is formed in the vertical direction thereto, in the NMR apparatus in which the solution sample is inserted to the horizontal magnetic field split type superconducting magnet from the above. In order to more efficiently cool the receive coil 1, there can be obtained the low temperature probe capable of executing the high sensitive measurement, on the basis of the structure in which the heat radiation shield 7 is arranged in the periphery of the sample insertion bore, and the coil displacement due to the heat contraction is absorbed.

Embodiment 2

An embodiment 2 is provided for explaining a structure assembling the structure shown in the embodiment 1 at a high precision. The outer container of the probe and the radiation shield at 100 K are respectively formed as divided structures, and are assembled by determining the positions of the coil portion and the sample space at a high precision.

The outer container 5 is divided into two or more portions. The respective portions are connected by an adhesive agent or the like via a seal by an O-ring or a metal seal so as to form a vacuum structure, and it is possible to easily assemble. The heat radiation shield is divided into two or more portions. The respective portions are mechanically connected, pinch a metal foil or a grease therebetween and are assembled by the adhesive agent. The adhesive agent employs an adhesive agent obtained by mixing powders of a good conductive material.

Figure 7A:
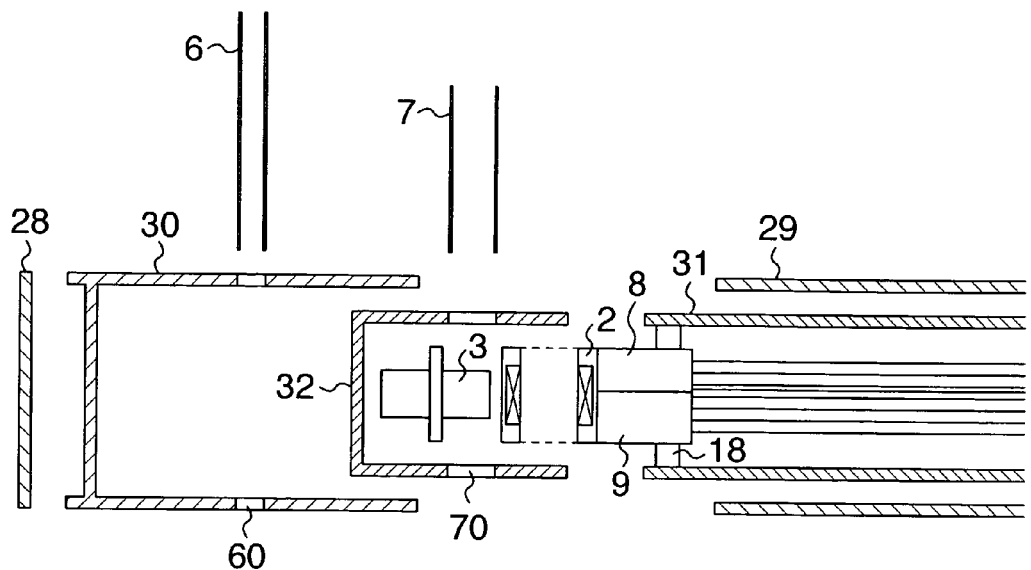
FIGS. 7A-7C is an assembly view of a low temperature probe in accordance with an embodiment 2.
Figure 7B:
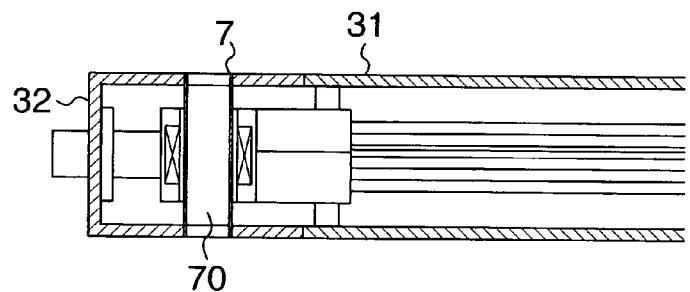
Figure 7C:
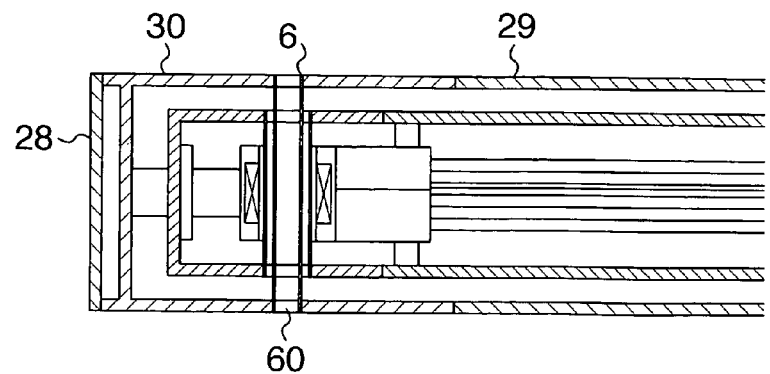

FIGS. 7A, 7B and 7C are assembly views showing the present embodiment. FIG. 7A shows a state before assembling the respective portions, in which the outer container 5 is separated into probe containers 29 and 30, the probe container 30 divides a cap 28, and a sample sleeve bore 60 is formed. The heat radiation shield 4 is separated into a first heat radiation shield 31 and a second heat radiation shield 32, and the second heat radiation shield 32 is provided with a heat radiation shield bore 70 to which the heat radiation shield bore sleeve 7 is inserted. The sample bore sleeve 6 and the heat radiation shield bore sleeve 70 correspond to parts before being assembled.

FIG. 7B shows a state in process of assembly. The respective members are assembled in accordance with the following procedure. The electric circuit portion 8 and the heat exchanger 9 are installed in a root direction with respect to the coil portion 2, and the fixing portion 3 is installed in a leading end direction with respect to the coil portion 2. The coil portion 2 is inserted to the first heat radiation shield 31 via the spacer 18. Further, the second heat radiation shield 32 is connected to the fixing portion 3. At this time, axes of the sample insertion portions are matched. Further, the heat radiation shield bore sleeve 7 is inserted to the heat radiation shield bore 70 so as to be connected.

In FIG. 7C, the entire of the previously assembled elements is inserted to the first probe container 29. The second probe container 30 is attached thereto and the axis of the sample insertion portion is brought into line therewith at this time. Further, the probe cap 28 is attached to a leading end of the second probe container 30. Finally, the sample bore sleeve 6 is attached to the sample bore 60 of the second probe container 30.

The low temperature probe in which the radiation shield is arranged can be assembled at a high precision by assembling the probe in accordance with the procedure mentioned above. A relation of connection between the respective members is as follows. A vacuum state is maintained between the second probe container 30 and the room temperature cap 28, and between the second probe container 30 and the sample bore sleeve 6. The second heat radiation shield 32 and the second probe container 30 are connected therebetween via the heat insulating fixing portion 3. The second radiation shield 32 and the radiation shield bore sleeve 7 are thermally connected therebetween. The coil portion 2 and the second heat radiation shield 32 are connected via the heat insulating fixing portion 3.

In this case, it is possible to assemble in such a manner as to approximately matching three elements comprising the center axis of the receive coil of the coil portion 2, the center axis of the sample bore sleeve and the center axis of the heat radiation shield bore sleeve with each other, by regulating the respective connecting positions.

It is desirable that the connection between the respective members employs a method by which the members can be easily detachable, for easily maintaining the coil portion and the circuit portion. For example, there is employed a screwing method or an easily peeled adhesive agent. It is necessary that the connection portion requires a vacuum seal-off, and an improved heat conduction. The O-ring or the metal seal is used for sealing off the vacuum. The sample bore portion which is hard to be pressed in structure, is adhered by an adhesive agent which can seal off the vacuum. In the case that the good heat conductivity is necessary, a contact area between the members to be connected is made large as well as fixing in accordance with the screwing, and a grease having a good heat conductivity or a metal foil is interposed therein. In the case of pinching the metal, a soft metal such as a gold, a silver, an indium or the like is desirable.

As mentioned above, since the low temperature probe in which the heat radiation shield is arranged can be assembled in accordance with the method of supporting the coil portion from the leading end of the probe via the fixing portion, it is possible to easily assemble the probe and it is possible to improve an assembling precision.

Embodiment 3

The embodiments 1 and 2 relates to the type in which the sample insertion portion is vertically formed with respect to the outer container of the probe horizontally inserted to the superconducting magnet, in the NMR device, however, the present invention is not limited to them. An embodiment 3 corresponds to an example in which the inserting axial direction of the sample is brought into line with the longitudinal direction of the cylindrical outer container of the probe.

Figure 8A:
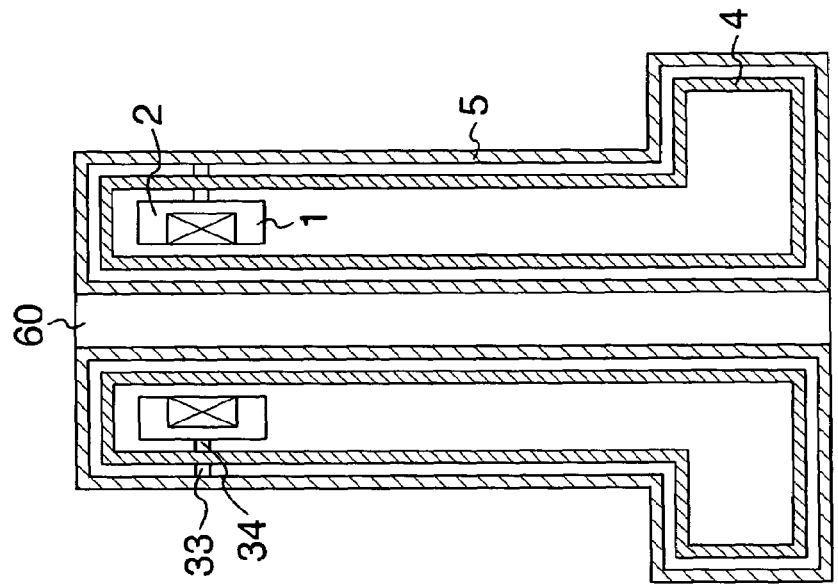
FIGS. 8A-8B is a skeleton schematic view of a low temperature probe in accordance with an embodiment 3.
Figure 8B:
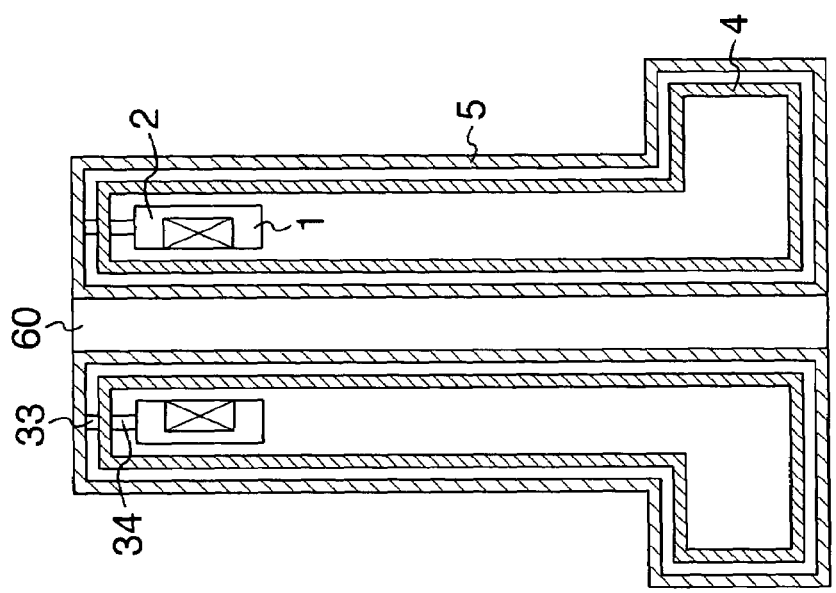

FIG. 8 shows a structure of a low temperature probe in accordance with the embodiment 3. In FIG. 8, the same reference numerals as those in FIG. 1 denote the same elements, and there are shown the transmit and receive coil 1, the coil portion 2, the heat radiation shield 4, the outer container 5 and the like. The fixing portion is shown by divided fixing portions 33 and 34.

The low temperature probe in accordance with the present embodiment is of a vertical insertion type, and is structured such that the length direction of the cylindrical outer container and the inserting axial direction of the sample are coaxially arranged. In this case, there can be obtained the effect of lowering the heat intrusion to the coil 1 and descending the temperature of the coil portion 2 on the basis of the effect of the heat radiation shield 4 kept at 100 K. In the vertical insertion type probe, a passing way of the gas regulating the temperature of the sample is arranged so as to pass through the probe.

In accordance with the probe of the present embodiment, in the case that the probe is fixed from the leading end, the contraction is generated in the same direction as the sample insertion axis. In this case, the coil position is shifted, however, the heat intrusion due to the contact is hardly generated. Further, in connection with the displacement of the coil, since the relation between the axes of the sample and the coil is kept while being greatly affected only by the displacement of the coil from the center of the superconducting magnet (the center of the magnetic field), the sensitivity of the coil is not changed. However, since it is hard to comprehend the accurate position of the center of the transmit and receive coil on the basis of the outer appearance, it is useful to make the displacement of the coil at a time of being cooled small.

A fixing method of the coil portion 2 includes (a) a method of fixing from the leading end, and (b) a method of fixing from the side surface. The fixing portion in both cases is constituted by a fixing portion 33 fixing the outer container 5 and the radiation shield 4, and a fixing portion 34 fixing the radiation shield 4 and the coil portion 2. Of course, in the same manner as the case of the horizontally inserting type in accordance with the embodiment 1, the fixing portion may be divided or integrated.

Since the present embodiment is fixed near the coil, the displacement of the heat contraction is relieved in the cable, the shaft, the pipe, the radiation shield and the like extending downward, by forming the movable portion or the elastic portion in the method described in the embodiment 1.

As mentioned above, in the vertical inserting type probe in accordance with the present embodiment, it is possible to arrange the radiation shield in the periphery of the receive coil, and it is possible to increase the sensitivity by descending the temperature of the receive coil.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A low temperature probe for an NMR comprising:
   a cylindrical outer container forming an outer shape of the probe and keeping an inner portion vacuum;
   a cylindrical sample insertion portion formed in a vertical direction to an axial direction of the outer container;
   a coil portion having a transmit and receive coil and arranged in such a manner as to surround the sample insertion portion;
   a first heat radiation shield kept at a temperature lower than an external temperature and higher than a temperature of the coil portion, the first heat radiation shield arranged between the outer container and the coil portion; and
   wherein a second heat radiation shield is provided at a small gap with respect to the sample insertion portion, in an inner side of a penetration portion of the heat radiation shield and the transmit and receive coil through which the sample insertion portion passes, and the first heat radiation shield and the second heat radiation shield are thermally connected.

2. A low temperature probe for an NMR as claimed in claim 1, wherein the coil portion and the first heat radiation shield are supported by a fixing portion extending in an axial direction from a leading end of the outer container.

3. An NMR device comprising:
a superconducting magnet generating a horizontal magnetic field;
a horizontal insertion type NMR probe inserted to a horizontal split of the superconducting magnet; and
a cooling device cooling the probe,
wherein the low temperature probe for the NMR as claimed in claim 1 is employed for the NMR probe.

4. A low temperature probe for an NMR comprising:
a cylindrical outer container forming an outer shape of the probe and keeping an inner portion vacuum;
a cylindrical sample insertion portion formed in a vertical direction to an axial direction of the outer container;
a coil portion having a transmit and receive coil and arranged in such a manner as to surround the sample insertion portion;
a first heat radiation shield kept at a temperature lower than an external temperature and higher than a temperature of the coil portion, the first heat radiation shield between arranged between the outer container and the coil portion;
wherein the coil portion and the first heat radiation shield are supported by a fixing portion extending in an axial direction from a leading end of the outer container; and
wherein the fixing portion is constituted by a first fixing portion connecting the outer container and the first heat radiation shield, and a second fixing portion connecting the first heat radiation shield and the coil portion.

5. A low temperature probe for an NMR comprising:
a cylindrical outer container forming an outer shape of the probe;
a cylindrical sample insertion portion formed in a vertical direction to an axial direction of the outer container;
a coil portion having a transmit and receive coil and arranged in such a manner as to surround the sample insertion portion; and
a first heat radiation shield kept at a temperature lower than an external temperature and higher than a temperature of the coil portion, the first heat radiation shield between arranged the outer container and the coil portion,
wherein the outer container and the first heat radiation shield are respectively divided, and structured such as to be freely assembled.

6. A low temperature probe for an NMR comprising:
a cylindrical outer container forming an outer shape of the probe and keeping an inner portion vacuum;
a cylindrical sample insertion portion formed in the same direction as an axial direction of the outer container;
a coil portion having a transmit and receive coil and arranged in such a manner as to surround the sample insertion portion;
a first heat radiation shield kept at a temperature lower than an external temperature and higher than a temperature of the coil portion, the first heat radiation shield between arranged the outer container and the coil portion; and
a second heat radiation shield provided at a small gap with respect to the sample insertion portion, in an inner side of a penetration portion of the heat radiation shield and the transmit and receive coil through which the sample insertion portion passes, and the first heat radiation shield and the second heat radiation shield are thermally connected.

7. A low temperature probe for an NMR as claimed in claim 6, wherein the coil portion and the first heat radiation shield are supported by a fixing portion extending in an axial direction from a leading end of the outer container.

8. An NMR device comprising:
a superconducting magnet generating a horizontal magnetic field;
a horizontal insertion type NMR probe inserted to a horizontal split of the superconducting magnet; and
a cooling device cooling the probe,
wherein the low temperature probe for the NMR as claimed in claim 6 is employed for the NMR probe.

* * * * *